(12) United States Patent
Fan et al.

(10) Patent No.: US 11,527,516 B2
(45) Date of Patent: Dec. 13, 2022

(54) MICRO LIGHT-EMITTING DIODE DISPLAY

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventors: Chia-Ming Fan, Guangdong (CN); Po-Lun Chen, Guangdong (CN); Chun-Ta Chen, Guangdong (CN); Po-Ching Lin, Guangdong (CN); Ya-Chu Hsu, Guangdong (CN); Chien-Yu Huang, Guangdong (CN); Ping-Hsiang Kao, Guangdong (CN)

(73) Assignees: Interface Technology (ChengDu) Co., Ltd., Sichuan (CN); Interface Optoelectronics (ShenZhen) Co., Ltd., Guangdong (CN); General Interface Solution Limited, Miaoli County (TW)

( * ) Notice: Subject to any disclaimer, the term of this patent is extended or adjusted under 35 U.S.C. 154(b) by 97 days.

(21) Appl. No.: 17/152,749

(22) Filed: Jan. 19, 2021

(65) Prior Publication Data
US 2022/0199586 A1  Jun. 23, 2022

(30) Foreign Application Priority Data

Dec. 22, 2020 (CN) .......................... 202011527843.9

(51) Int. Cl.
*H01L 25/075* (2006.01)
*H01L 33/54* (2010.01)
*H01L 33/56* (2010.01)
*H01L 33/58* (2010.01)

(52) U.S. Cl.
CPC .......... *H01L 25/0753* (2013.01); *H01L 33/54* (2013.01); *H01L 33/56* (2013.01); *H01L 33/58* (2013.01); *H01L 2933/005* (2013.01)

(58) Field of Classification Search
CPC ..... H01L 25/0753; H01L 33/54; H01L 33/56; H01L 33/58; H01L 2933/005
See application file for complete search history.

(56) References Cited

U.S. PATENT DOCUMENTS

2019/0196063 A1* 6/2019 Gui .................. G02F 1/133502
2022/0093834 A1* 3/2022 Lin ......................... H01L 33/50

* cited by examiner

*Primary Examiner* — Jay C Chang
*Assistant Examiner* — Mikka Liu
(74) *Attorney, Agent, or Firm* — CKC & Partners Co., LLC

(57) ABSTRACT

A micro light-emitting diode (micro LED) display and a package method thereof are described. The micro LED display includes a substrate, various micro LED chips, and an encapsulation film. The substrate includes a wire. The micro LED chips are disposed on a surface of the substrate and are electrically connected to the wire. A light-emitting surface of each of the micro LED chips is set with at least one micro structure, and each micro structure has a top end. The encapsulation film encapsulates the micro LED chips, and covers the surface of the substrate. The top ends of the micro structures are located in a light-emitting surface of the encapsulation film.

12 Claims, 13 Drawing Sheets

MICRO LIGHT-EMITTING DIODE DISPLAY

RELATED APPLICATIONS

This application claims priority to China Application Serial Number 202011527843.9, filed Dec. 22, 2020, which is herein incorporated by reference.

BACKGROUND

Field of Invention

The present disclosure relates to a package technique of a display, and more particularly, to a micro light-emitting diode (micro LED) display and a package method thereof.

Description of Related Art

As an optoelectronics industry is flourishingly developed, a display technique has advanced from a liquid crystal display (LCD) to an organic light emitting display (OLED), and further to an emerging micro LED display now. In a manufacturing process of the micro LED display, red, green, and blue individual micro LED chips are transferred and adhered to a substrate, which is prefabricated with electrodes and a drive wire, via a mass transfer technique. Electrodes of the micro LED chips may be connected to the drive wire by using a conductive bonding material, such as solder paste or an anisotropic conductive film (ACF). The conductive bonding material can simultaneously provide a conduction circuit function and a fixing function.

The micro LED chip transferred to the substrate via the mass transfer technique is bonded to the wire of the substrate only by the conductive bonding layer therebetween. However, sizes of the micro LED chips are very small, such that sizes of the conductive bonding layers are also very small, and adhesion forces of the micro LED chips to the substrate are weak. Thus, when the micro LED chips are subjected to an external force, the micro LED chips carry a very high risk of falling off. Especially when the micro LED chips are mounted on a flexible substrate for a flexible display application, if no suitable protection layer is used, the micro LED chips very easily fall off while the flexible substrate is bent. After the substrate is bent, the micro LED chips, which are not protected by a protection layer, fall off to leave vacancies on the conductive wire of the substrate, and thus degrading product reliability. Therefore, the micro LED display needs a suitable package design to prevent the micro LED chips from falling off.

Currently, common package methods of the micro LED displays may be mainly divided into two types. In the first type, three micro LED chips are encapsulated to form a larger module, and the modules are adhered to a wire of a substrate by using a mass transfer technique. Compared to one single micro LED chip, the module is larger and can be adhered to the substrate with a greater adhesion force, such that the module can withstand an external force without failing off. However, there is a gap between any adjacent two of the modules on the substrate, such that when the display is viewed close, a viewer obviously feels surface unevenness caused by the gaps, and thus limiting a viewing distance of the display.

In the second type, micro LED chips are firstly adhered to a wire of a substrate by using a mass transfer technique, encapsulation glue is applied on the substrate by using a coating process, and the encapsulation glue is cured to form a protection layer. However, this package method needs an additional coating apparatus and an additional process for the encapsulation glue, such that cost is increased. In addition, it is not easily to control when the coating process is applied on a flexible substrate. Furthermore, non-uniform coating thickness of the encapsulation glue causes uneven light emission of the micro LED display.

SUMMARY

Therefore, one objective of the present disclosure is to provide a micro LED display and a package method thereof, which encapsulates the micro LED display by pressing a softened encapsulation film, such that an additional coating process of encapsulation glue is omitted to reduce cost of the package process, the encapsulation film and micro LED chips are tightly combined to increase structure stability of the micro LED display, and a surface of the micro LED display is evened to enhance display quality.

According to the aforementioned objectives, the present disclosure provides a micro LED display, which includes a substrate, various micro LED chips, and an encapsulation film. The substrate includes a wire. The micro LED chips are disposed on a surface of the substrate and are electrically connected to the wire. A light-emitting surface of each of the micro LED chips is set with at least one micro structure, and each of the micro structure has a top end. The encapsulation film encapsulates the micro LED chips, and covers the surface of the substrate. The top ends of the micro structures are located in a light-emitting surface of the encapsulation film.

According to one embodiment of the present disclosure, each of the micro structures includes a cone, a polygon pyramid, an arc lens, a micro lens, a cone frustum, or a polygon frustum.

According to one embodiment of the present disclosure, the micro structures have a same shape and a same size.

According to one embodiment of the present disclosure, a refractive index of each of the micro structures is greater than a refractive index of the encapsulation film, and is smaller than a refractive index of a semiconductor layer of each of the micro light-emitting diode chips.

According to one embodiment of the present disclosure, a height of each of the micro structures ranges from about 3 μm to about 10 μm.

According to one embodiment of the present disclosure, each of the micro structures is a light-guiding structure, and the light-guiding structure includes a main body and a reflective layer covering a side surface of the main body.

According to one embodiment of the present disclosure, each of the micro structures includes an inverted frustum structure, and the inverted frustum structure includes a reflective side surface.

According to one embodiment of the present disclosure, materials of the micro structures include silicon dioxide, titanium dioxide, aluminum oxide ($Al_2O_3$), or any combination thereof.

According to one embodiment of the present disclosure, the encapsulation film completely covers the surface of the substrate.

According to one embodiment of the present disclosure, the encapsulation film includes various encapsulation film blocks, and the encapsulation film blocks are separated from each other.

According to one embodiment of the present disclosure, the micro LED chips are divided into various groups, and the encapsulation film blocks respectively encapsulate the groups.

According to one embodiment of the present disclosure, a material of the encapsulation film includes ethylene vinyl acetate (EVA), polymethyl methacrylate (PMMA), acrylic acid, resin, rubber, polyurethane, or any combination thereof.

According to one embodiment of the present disclosure, a bottom surface of the micro structure on each of the micro LED chips is smaller than or equal to the light-emitting surface of the micro LED chip.

According to the aforementioned objectives, the present disclosure provides a package method of a micro LED display. In this method, various micro LED chips are disposed on a surface of a substrate. The disposing of the micro LED chips includes electrically connecting the micro LED chips and a wire of the substrate. A light-emitting surface of each of the micro LED chips is set with at least one micro structure. An encapsulation film is softened. The softened encapsulation film is pressed on the surface of the substrate by using a pressure plate until a top end of each of the micro structures contacts the pressure plate.

According to one embodiment of the present disclosure, the encapsulation film includes a thermoplastic material, and the softening of the encapsulation film includes heating the encapsulation film.

According to one embodiment of the present disclosure, the softening of the encapsulation film includes heating the encapsulation film by using a heating plate or an infrared heater.

According to one embodiment of the present disclosure, the softening of the encapsulation film includes rising a temperature of the encapsulation film to a range from about 80 degrees centigrade to about 150 degrees centigrade.

According to the aforementioned objectives, the present disclosure provides a package method of a micro LED display. In this method, various micro LED chips are disposed on a surface of a substrate. The disposing of the micro LED chips includes electrically connecting the micro LED chips and a wire of the substrate. The micro LED chips are divided into various groups. A light-emitting surface of each of the micro LED chips is set with at least one micro structure. Various encapsulation film blocks on a pressure plate are softened. The softened encapsulation film blocks are pressed on the surface of the substrate by using the pressure plate to use the encapsulation film blocks respectively and correspondingly encapsulating the groups of the micro LED chips. The pressing of the softened encapsulation film blocks on the surface of the substrate includes flushing a top end of each of the micro structures and a surface of each of the encapsulation film blocks.

According to one embodiment of the present disclosure, each of the encapsulation film blocks includes a thermoplastic material, and the softening of the encapsulation film blocks includes heating the encapsulation film blocks.

According to one embodiment of the present disclosure, the softening of the encapsulation film blocks includes heating the encapsulation film blocks by using a heating plate or an infrared heater.

According to one embodiment of the present disclosure, the softening of the encapsulation film blocks includes heating the encapsulation film blocks through the pressure plate.

According to one embodiment of the present disclosure, the softening of the encapsulation film blocks includes rising temperatures of the encapsulation film blocks to a range from about 80 degrees centigrade to about 150 degrees centigrade.

According to one embodiment of the present disclosure, the encapsulation film blocks pressed on the surface of the substrate are separated from each other.

According to one embodiment of the present disclosure, the pressing of the softened encapsulation film blocks on the surface of the substrate includes make the micro structures of the micro light-emitting diode chips of each of the groups penetrate the corresponding encapsulation film block until the micro structures are against the pressure plate.

The embodiment of the present disclosure encapsulates the micro LED chips by mounting the micro structures on the substrate, softening the encapsulation film, and pressing the softened encapsulation film on the substrate and the micro LED chips by using the pressure plate. When the encapsulation film is pressed, the micro structures penetrate the encapsulation film to be against the pressure plate, such that all of the micro LED chips are completely encapsulated in the encapsulation film, and thus the encapsulation film and the micro LED chips are tightly combined, thereby increasing stability of the micro LED chips on the substrate. In addition, the process of the package method, which is performed by pressing the softened encapsulation film, is easily controlled, and an additional coating process of the encapsulation glue is omitted, such that cost of a coating apparatus is eliminated, thereby decreasing process cost.

Furthermore, the micro structures on the micro LED chips are flush with the light-emitting surface of the encapsulation film, such that the surface of the micro LED display is even, thereby enhancing display quality of the micro LED display. Moreover, the micro structures on the light-emitting surfaces of the micro LED chips prevent light emitted by the micro LED chips from being limited by the inner structures, such that light extraction of the micro LED chips is increased.

BRIEF DESCRIPTION OF THE DRAWINGS

Aspects of the present disclosure are best understood from the following detailed description in conjunction with the accompanying figures. It is noted that in accordance with the standard practice in the industry, various features are not drawn to scale. In fact, dimensions of the various features can be arbitrarily increased or reduced for clarity of discussion.

DETAILED DESCRIPTION

Figure 1:
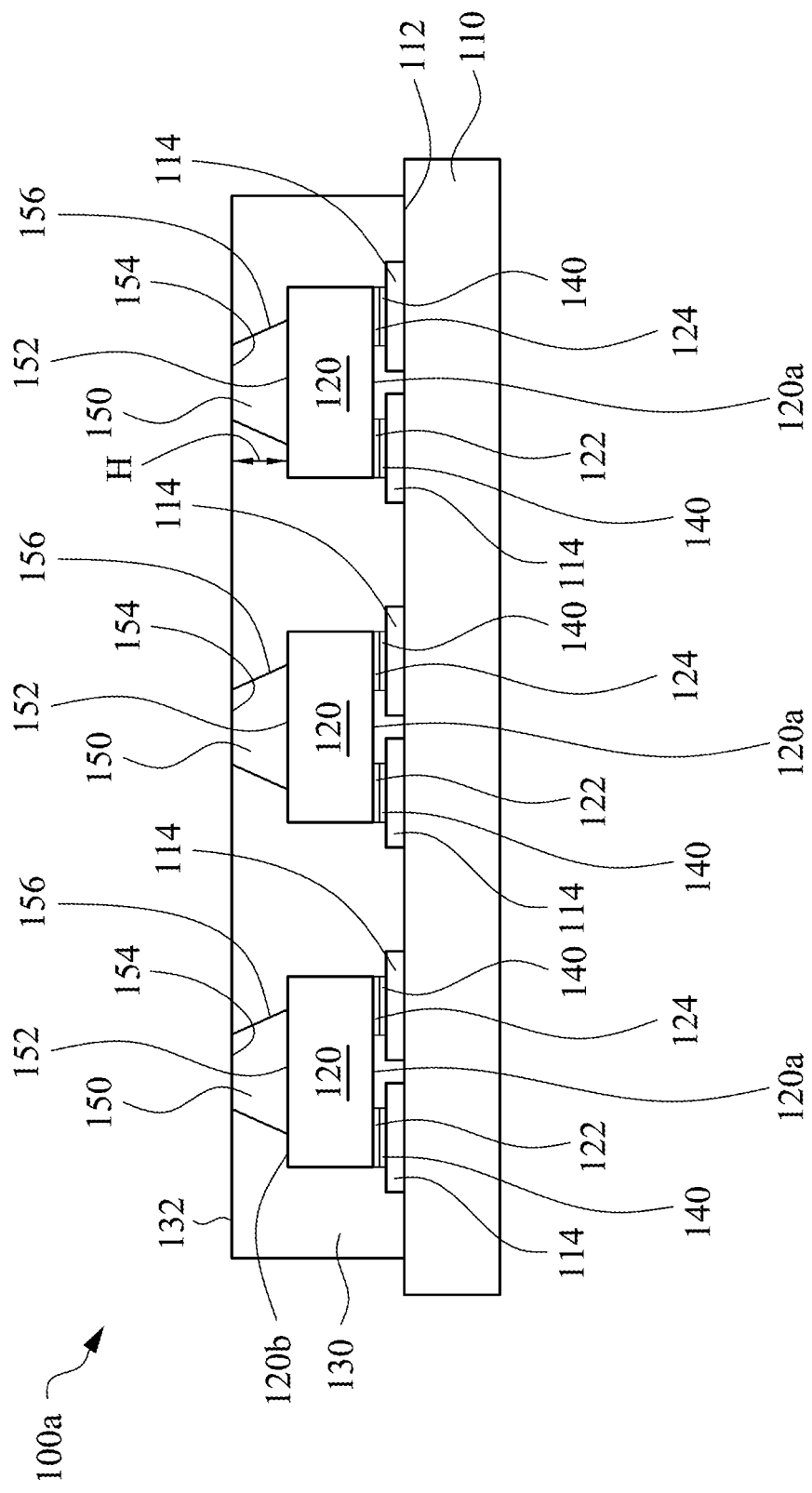
FIG. 1 is a schematic partial cross-sectional view of a micro LED display in accordance with one embodiment of the present disclosure.

The embodiments of the present disclosure are discussed in detail below. However, it will be appreciated that the embodiments provide many applicable concepts that can be implemented in various specific contents. The embodiments discussed and disclosed are for illustrative purposes only and are not intended to limit the scope of the present disclosure. All of the embodiments of the present disclosure disclose various different features, and these features may be implemented separately or in combination as desired.

In addition, the terms "first", "second", and the like, as used herein, are not intended to mean a sequence or order, and are merely used to distinguish elements or operations described in the same technical terms.

The spatial relationship between two elements described in the present disclosure applies not only to the orientation depicted in the drawings, but also to the orientations not represented by the drawings, such as the orientation of the inversion. Moreover, the terms "connected", "electrically connected", or the like between two components referred to in the present disclosure are not limited to the direct connection or electrical connection of the two components, and may also include indirect connection or electrical connection as required.

Referring to FIG. 1, FIG. 1 is a schematic partial cross-sectional view of a micro LED display in accordance with one embodiment of the present disclosure. A micro LED display 100a may mainly include a substrate 110, various micro LED chips 120, and an encapsulation film 130. For example, a material of the substrate 110 may include glass, polyimide (PI), polyethylene terephthalate (PET), or polycarbonate (PC). A surface 112 of the substrate 110 is set with a conductive wire 114. The wire 114 may be electrically connected to the micro LED chips 120 to drive and turn on the micro LED chips 120.

These micro LED chips 120 may include many micro LED chips that emit light of different colors. In some examples, the micro LED chips 120 include red LED chips, green LED chips, and blue LED chips. The colors of light emitted by the micro LED chips 120 may depend on product requirements, and the present disclosure is not limited thereto. Each of the micro LED chips 120 may include semiconductor material layers of two different conductivities and a light-emitting layer sandwiched between the two semiconductor material layers. For example, the two semiconductor material layers may respectively be an N-type semiconductor layer and a P-type semiconductor layer, and the light-emitting layer may include a multiple quantum well (MQW) structure. Materials of the semiconductor material layers and the light-emitting layer may be GaInP or GaN, for example. Refractive indexes of the semiconductor material layers and the light-emitting layer may be, for example, in a range from 2.4 to 3.4.

As shown in FIG. 1, each of the micro LED chips 120 has a connection surface 120a and a light-emitting surface 120b, in which the connection surface 120a and the light-emitting surface 120b are respectively located on two opposite sides of the micro LED chip 120. Each of the micro LED chips 120 may further include a first electrode 122 and a second electrode 124, in which the first electrode 122 and the second electrode 124 are disposed on the connection surface 120a and are separated from each other. The micro LED chips 120 are disposed on the surface 112 of the substrate 110, and each of the micro LED chips 120 may be connected to the wire 114 of the substrate 110 by using conductive bonding layers 140 to achieve electrical connection with the wire 114. The first electrode 122 and the second electrode 124 of the micro LED chip 120 are electrically connected to the wire 114 by the conductive bonding layers 140 respectively. For example, the conductive bonding layers 140 may be solder pastes or anisotropic conductive films. The conductive bonding layers 140 may be any suitable conductive bonding material, and the present disclosure is not limited thereto.

The light-emitting surface 120b of each of the micro LED chips 120 may be set with one or more micro structures 150. For example, as shown in FIG. 1, the light-emitting surface 120b of each of the micro LED chips 120 may be set with one micro structure 150. These micro structures 150 may include cones, polygon pyramids, arc lenses, micro lenses, cone frustums, or polygon frustums, in which the polygon pyramids may be triangular pyramids and quadrilateral pyramids, etc., for example. Shapes of the micro structures 150 may depend on product and process requirements and are not limited thereto.

In some examples, the micro structures 150 of the micro LED chips 120 have the same shape and the same size. In other examples, the shapes and the sizes of the micro structures 150 of the micro LED chips 120 are not all the same, the micro structures 150 of portions of the micro LED chips 120 may have the same shape and the same size, and the shapes and the sizes of the micro structures 150 of the other portions of the micro LED chips 120 are different from those of the micro structures 150 of the portions of the micro LED chips 120. In addition, the shapes and the sizes of the micro structures 150 of the other portions of the micro LED chips 120 may be the same or may be different from each other. For example, the micro structures 150 of the red micro LED chips 120 may be cones, the micro structures 150 of the green micro LED chips 120 may be quadrilateral pyramids, and the micro structures 150 of the blue micro LED chips 120 may be semicircle lenses.

Figure 2:
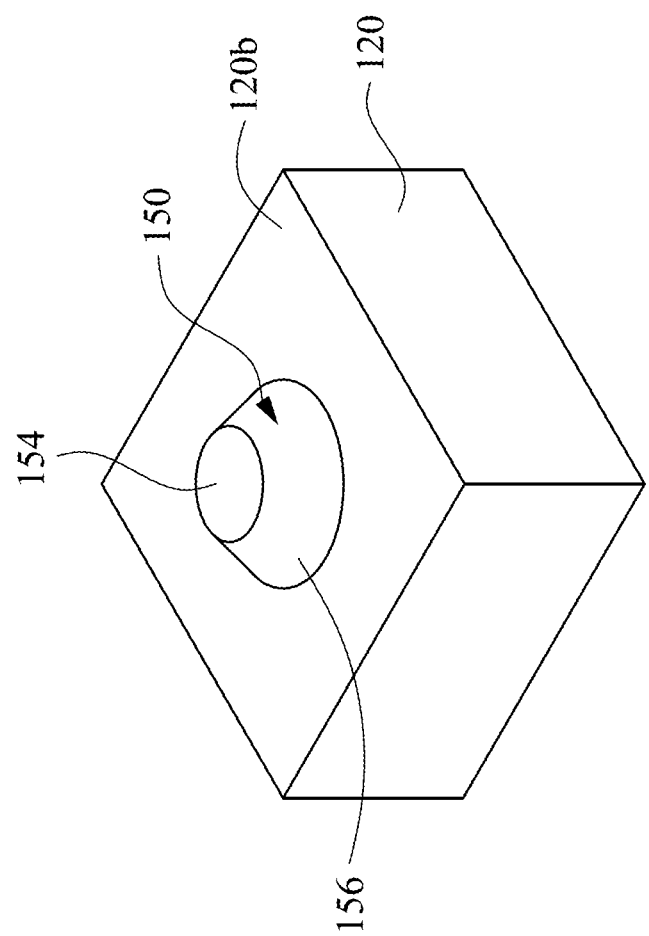
FIG. 2 is a schematic enlarged three-dimensional diagram of a micro LED chip in accordance with one embodiment of the present disclosure.

Each of the micro structures 150 has a bottom surface 152. In the examples that the light-emitting surface 120b of each of the micro LED chips 120 is only set with one single micro structure 150, the bottom surface 152 of the micro structure 150 is smaller than or equal to the light-emitting surface 120b of the micro LED chip 120. Referring to FIG. 1 and FIG. 2 simultaneously, FIG. 2 is a schematic enlarged three-dimensional diagram of a micro LED chip in accordance with one embodiment of the present disclosure. In the example shown in FIG. 1 and FIG. 2, the micro structure 150 does not occupy the entire light-emitting surface 120b of the micro LED chip 120, and the bottom surface 152 of the micro structure 150 is smaller than the light-emitting surface 120b of the micro LED chip 120. In some exemplary examples, a height H of the micro structure 150 may range from about 3 μm to about 10 μm.

The light-emitting surface 120b of each of the micro LED chips 120 may be set with several micro structures 150. In such examples, the micro structures 150 on one of the micro LED chip 120 may have the same shape and the same size, the same shape and different sizes, or different shapes. For example, when one of the micro LED chips 120 is set with two micro structures 150, the two micro structures 150 may be two cone frustums having the same size, one cone frustum having a larger bottom surface and the other one cone frustum having a smaller bottom surface, or one cone frustum and one quadrilateral pyramid.

Each of the micro structures 150 has a top end 154, which is opposite to the bottom surface 152. The top ends 154 may be dots or flat surfaces. In the examples that the micro structures 150 are tapered structures, such as cones or pyramids, arc lens, or micro lenses, the top ends 154 of the micro structures 150 are apexes or tangent points. In the examples that the micro structures 150 are frustums, such as cone frustums or polygon frustums, the top ends 154 of the micro structures 150 are flat surfaces. Each of the micro structures 150 also has a side surface 156, in which the side surface 156 inclines inwardly from the bottom surface 152 extending to the top end 154.

The micro structures 150 may be made of transparent materials. In order to increase light extraction of the micro LED display 100*a*, the material of the micro structure 150 may be selected from the materials that have refractive indexes smaller than that of the material of the adjoining semiconductor layer of the micro LED chip 120. In addition, the refractive indexes of the micro structures 150 may be greater than that of the encapsulation film 130. The refractive indexes of the micro structures 150 may be in a range from 1 to 2.4. In some exemplary examples, the materials of the micro structures 150 include silicon dioxide, titanium dioxide, aluminum oxide, or any combination thereof.

Figure 3C:
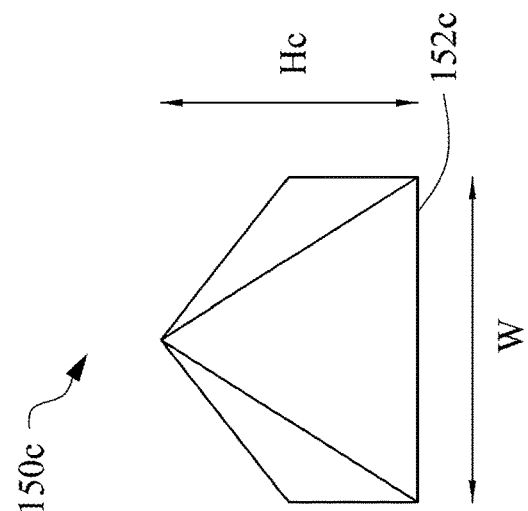
FIG. 3C is a schematic enlarged three-dimensional diagram of a micro structure in accordance with one embodiment of the present disclosure.
Figure 3B:
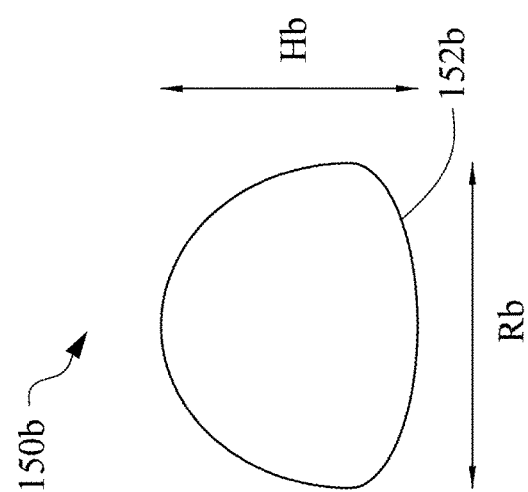
FIG. 3B is a schematic enlarged three-dimensional diagram of a micro structure in accordance with one embodiment of the present disclosure.
Figure 3A:
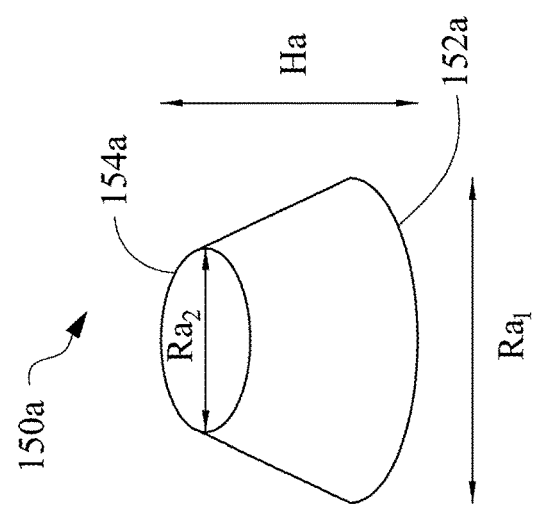
FIG. 3A is a schematic enlarged three-dimensional diagram of a micro structure in accordance with one embodiment of the present disclosure.

Referring to FIG. 3A, FIG. 3A is a schematic enlarged three-dimensional diagram of a micro structure in accordance with one embodiment of the present disclosure. A micro structure 150*a* in the present embodiment is a cone frustum structure. The micro structure 150*a* has a bottom surface 152*a* and a top surface 154*a*, which are opposite to each other. The bottom surface 152*a* and the top surface 154*a* are circular. An area of the bottom surface 152*a* is greater than that of the top surface 154*a*. In some exemplary examples, a diameter $Ra_1$ of the bottom surface 152*a* may range from about 3 μm to about 30 μm, and a diameter $Ra_2$ of the top surface 154*a* may be greater than 0 and up to about 30 μm. A height Ha of the micro structure 150*a* may be in a range from about 3 μm to about 10 μm. A ratio of the diameter $Ra_1$ of the bottom surface 152*a* to the height Ha may range from about 1 to about 3.

Referring to FIG. 3B, FIG. 3B is a schematic enlarged three-dimensional diagram of a micro structure in accordance with one embodiment of the present disclosure. A micro structure 150*b* in the present embodiment is an arc lens. A bottom surface 152*b* of the micro structure 150*b* is circular. In some exemplary examples, a diameter Rb of the bottom surface 152*b* may range from about 3 μm to about 30 μm. A height Hb of the micro structure 150*b* may be in a range from about 3 μm to about 10 μm. A ratio of the diameter Rb of the bottom surface 152*b* to the height Hb may range from about 1 to about 3.

Referring to FIG. 3C, FIG. 3C is a schematic enlarged three-dimensional diagram of a micro structure in accordance with one embodiment of the present disclosure. A micro structure 150*c* in the present embodiment is a quadrilateral pyramid structure. A bottom surface 152*c* of the micro structure 150*c* is quadrilateral. In some exemplary examples, a width W of the bottom surface 152*c* may range from about 3 μm to about 30 μm. A height Hc of the micro structure 150*c* may be in a range from about 3 μm to about 10 μm. A ratio of the width W to the height Hc may range from about 1 to about 3.

Referring to FIG. 1 continuously, the encapsulation film 130 is disposed on the surface 112 of the substrate 110 and completely encapsulates all of the micro LED chips 120. The encapsulation film 130 may completely cover the surface 112 of the substrate 110. In other examples, the encapsulation film 130 may only cover local areas of the surface 112 of the substrate 110. The encapsulation film 130 also covers all of the micro structures 150, in which the top ends 154 of the micro structures 150 are exposed for benefiting light extraction. The encapsulation film 130 has a light-emitting surface 132, and the light-emitting surface 132 is a flat surface. In some examples, the light-emitting surface 132 of the encapsulation film 130 is flush with the top ends 154 of the micro structures 150, i.e. the top ends 154 of the micro structures 150 are located in the light-emitting surface 132 of the encapsulation film 130. In some examples, the micro structures 150 may not penetrate the encapsulation film 130 completely, such that the encapsulation film 130 may encapsulate the micro structures 150 completely, and the top ends 154 of the micro structures 150 are not exposed.

The encapsulation film 130 may include a thermoplastic material, such that the encapsulation film 130 may be softened by using a heating method. In addition, the material of the encapsulation film 130 may be selected from the materials that have refractive indexes smaller than that of the micro structures 150. In some exemplary examples, the material of the encapsulation film 130 includes ethylene vinyl acetate (EVA), polymethyl methacrylate (PMMA), acrylic acid, resin, rubber, polyurethane, or any combination thereof.

The micro structure 150 is disposed on the light-emitting surface 120*b* of each of the micro LED chips 120, such that it prevents light emitted by the micro LED chip 120 from being limited by the inner structure of the micro LED chip 120, thereby increasing light extraction of the micro LED chip 120. In addition, the encapsulation film 130 not only encapsulates all of the micro LED chips 120 completely, but also fill up gaps between the micro LED chips 120, such that the encapsulation film 130, the micro LED chips 120, and the substrate 110 can be combined tightly, thereby enhancing stability of the micro LED chips 120 on the substrate 110. Furthermore, the micro structures 150 on the micro LED chips 120 are flush with the light-emitting surface 132 of the encapsulation film 130, such that the micro LED display 100*a* has a flat light-emitting surface, thereby enhancing display quality of the micro LED display 100*a*.

Figure 4:
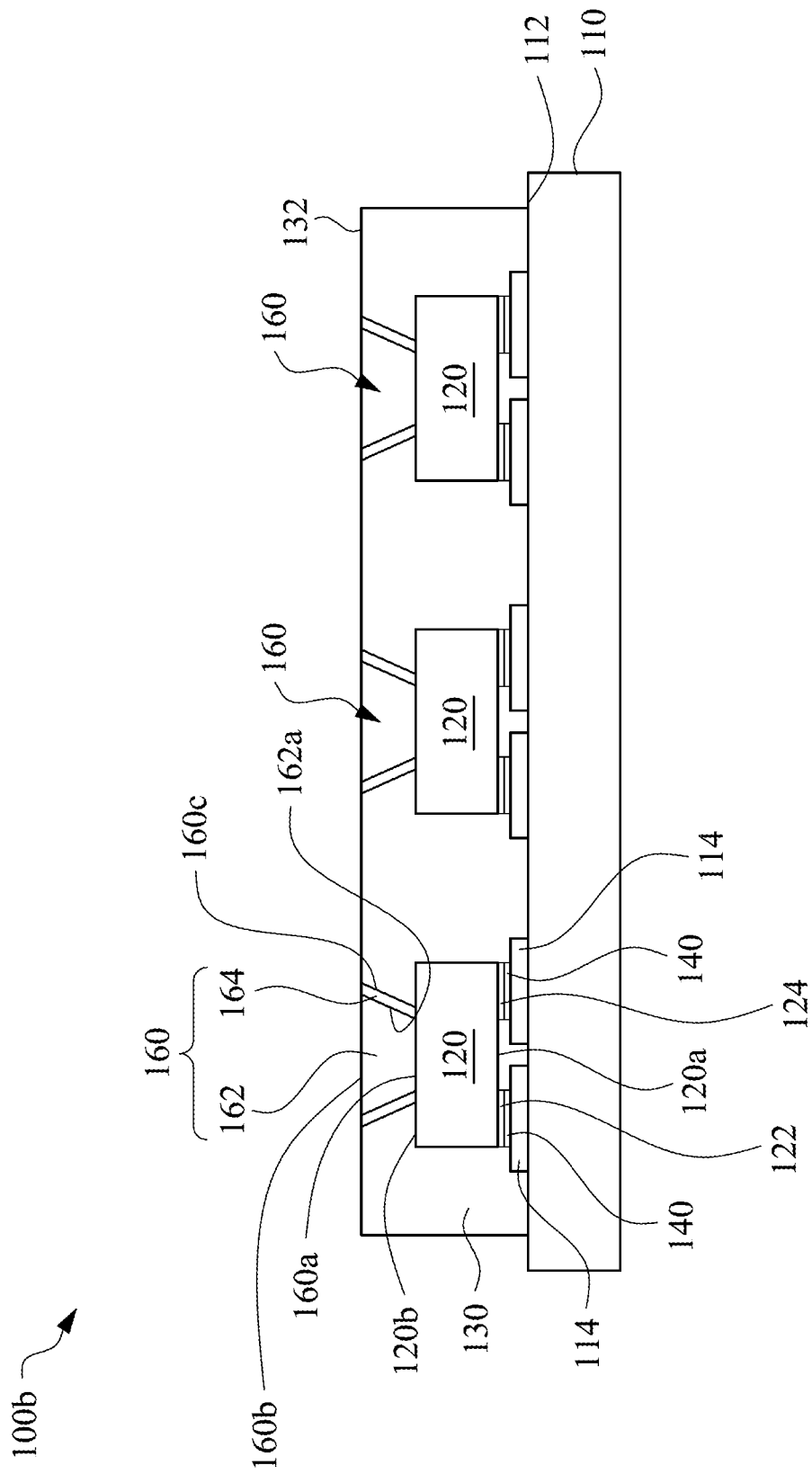
FIG. 4 is a schematic partial cross-sectional view of a micro LED display in accordance with one embodiment of the present disclosure.

Referring to FIG. 4, FIG. 4 is a schematic partial cross-sectional view of a micro LED display in accordance with one embodiment of the present disclosure. A structure of a micro LED display 100*b* of the present embodiment is substantially similar to that of the micro LED display 100*a* of the aforementioned embodiment, a difference between the micro LED displays 100*b* and 100*a* is that micro structures 160 on the light-emitting surfaces 120*b* of the micro LED chips 120 of the micro LED display 100*b* are light-guiding structures.

In some examples, the micro structures 160 may be inverted frustum structures, such as inverted cone frustum structures or inverted polygon frustum structures. That is, each of the micro structures 160 has a bottom surface 160*a* and a top surface 160*b*, in which an area of the top surface 160*b* is greater than that of the bottom surface 160*a*. The micro structure 160 also has a side surface 160*c*, in which the side surface 160*c* inclines outwardly from the bottom surface 160*a* extending to the top surface 160*b*. The side surface 160*c* of the micro structure 160 is a light reflecting surface, such that the micro structure 160 can form a reflective cup to effectively guide light emitted by the micro LED chip 120.

In some exemplary examples, referring to FIG. 4 continuously, each of the micro structure 160 includes a main body 162 and a reflective layer 164. The main body 162 is an inverted frustum structure, such as an inverted cone frustum structure or an inverted polygon frustum structure. Therefore, the main body 162 has an inclined side surface 162a. The main body 162 is made of a transparent material. In addition, the material of the main body 162 may be selected from the materials that have refractive indexes smaller than that of the adjoining semiconductor layer of the micro LED chip 120. In some exemplary examples, the material of the main body 162 includes silicon dioxide, titanium dioxide, aluminum oxide, or any combination thereof. The reflective layer 164 covers the side surface 162a of the main body 162, so as to form the micro structure 160 being a reflective cup. In some certain examples, when the side surface 162a of the main body 162 of the micro structure 160 has a light-reflecting function, the reflective layer 164 can be omitted.

Figure 5:
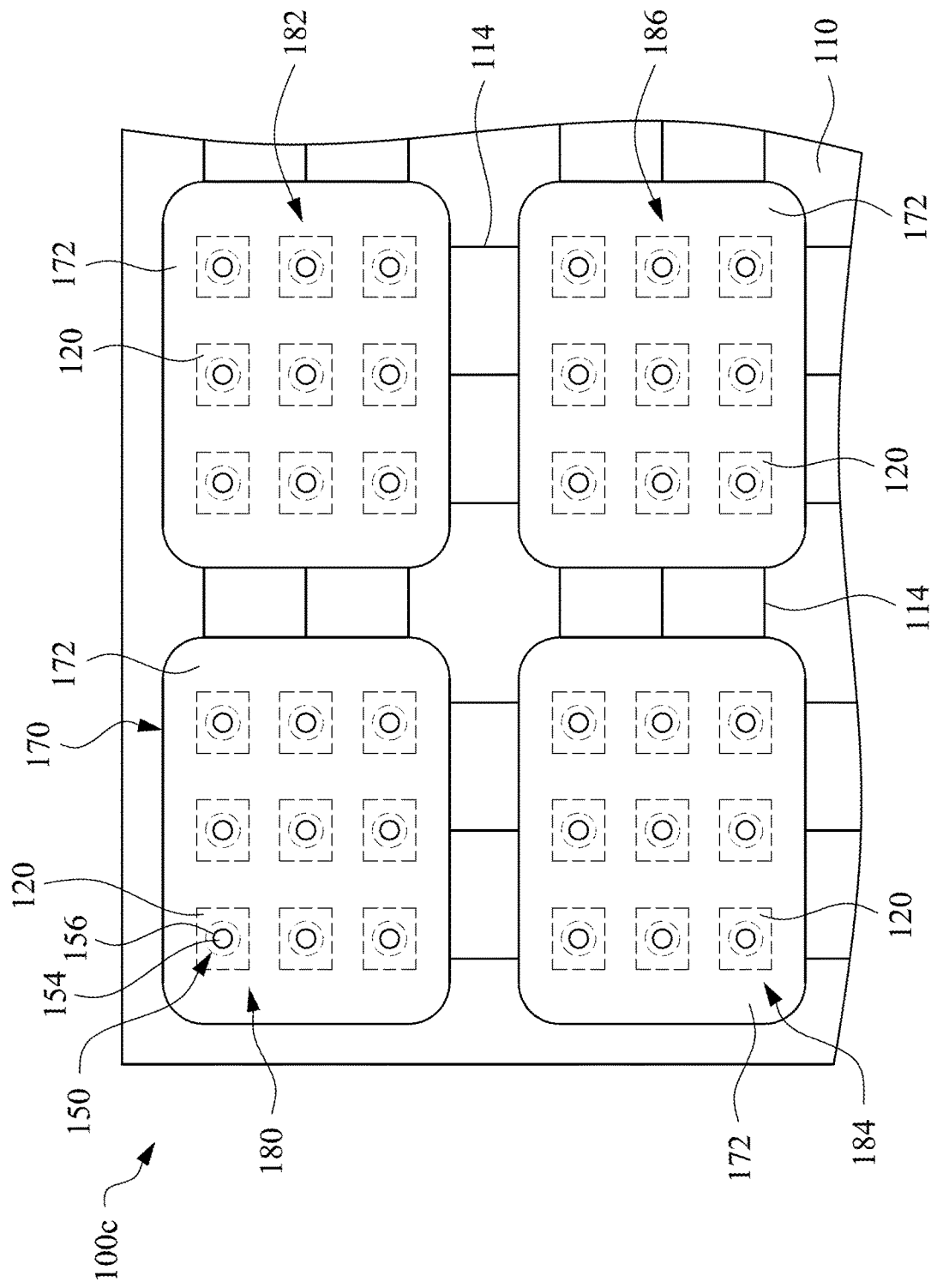
FIG. 5 is a schematic partial top view of a micro LED display in accordance with one embodiment of the present disclosure.

Referring to FIG. 5, FIG. 5 is a schematic partial top view of a micro LED display in accordance with one embodiment of the present disclosure. A structure of a micro LED display 100c of the present embodiment is substantially similar to that of the micro LED display 100a of the aforementioned embodiment, a difference between the micro LED displays 100c and 100a is that an encapsulation film 170 of the micro LED display 100c includes various encapsulation film blocks 172, which are separated from each other physically, and is not one single continuous encapsulation film layer.

In the micro LED display 100c, each of the encapsulation film blocks 172 encapsulates several micro LED chips 120 and covers the side surfaces 156 of the micro structures 150 disposed thereon. For example, as shown in FIG. 5, each of the encapsulation film blocks 172 encapsulates nine micro LED chips 120 and covers the side surfaces 156 of the micro structures 150 disposed thereon. In other words, all of the micro LED chips 120 of the micro LED display 100c may be divided into various groups 180, 182, 184, and 186, and each of the groups 180, 182, 184, and 186 may include nine micro LED chips 120, for example. In the present disclosure, quantity of the micro LED chips 120 of each group has to be greater than one to make the encapsulation film block 172 and the micro LED chips 120 encapsulated by the encapsulation film block 172 have a greater adhesive force to the substrate 110. The quantity of the micro LED chips 120 of each group may be adjusted according to the product and process requirements, and the present disclosure is not limited to the aforementioned example.

Figure 6A:
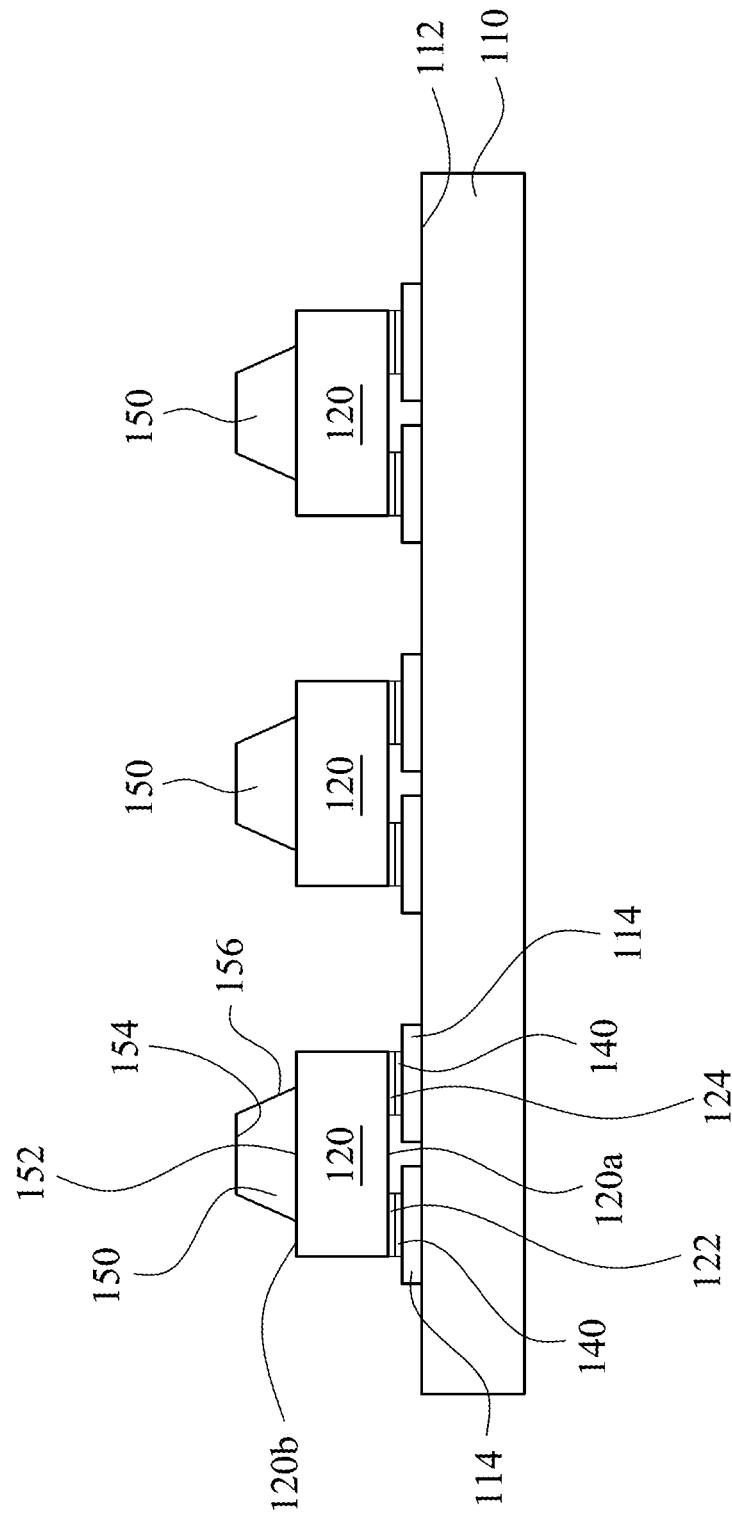
FIG. 6A to FIG. 6D are schematic partial cross-sectional views of various stages showing a package method of a micro LED display in accordance with one embodiment of the present disclosure.
Figure 6B:
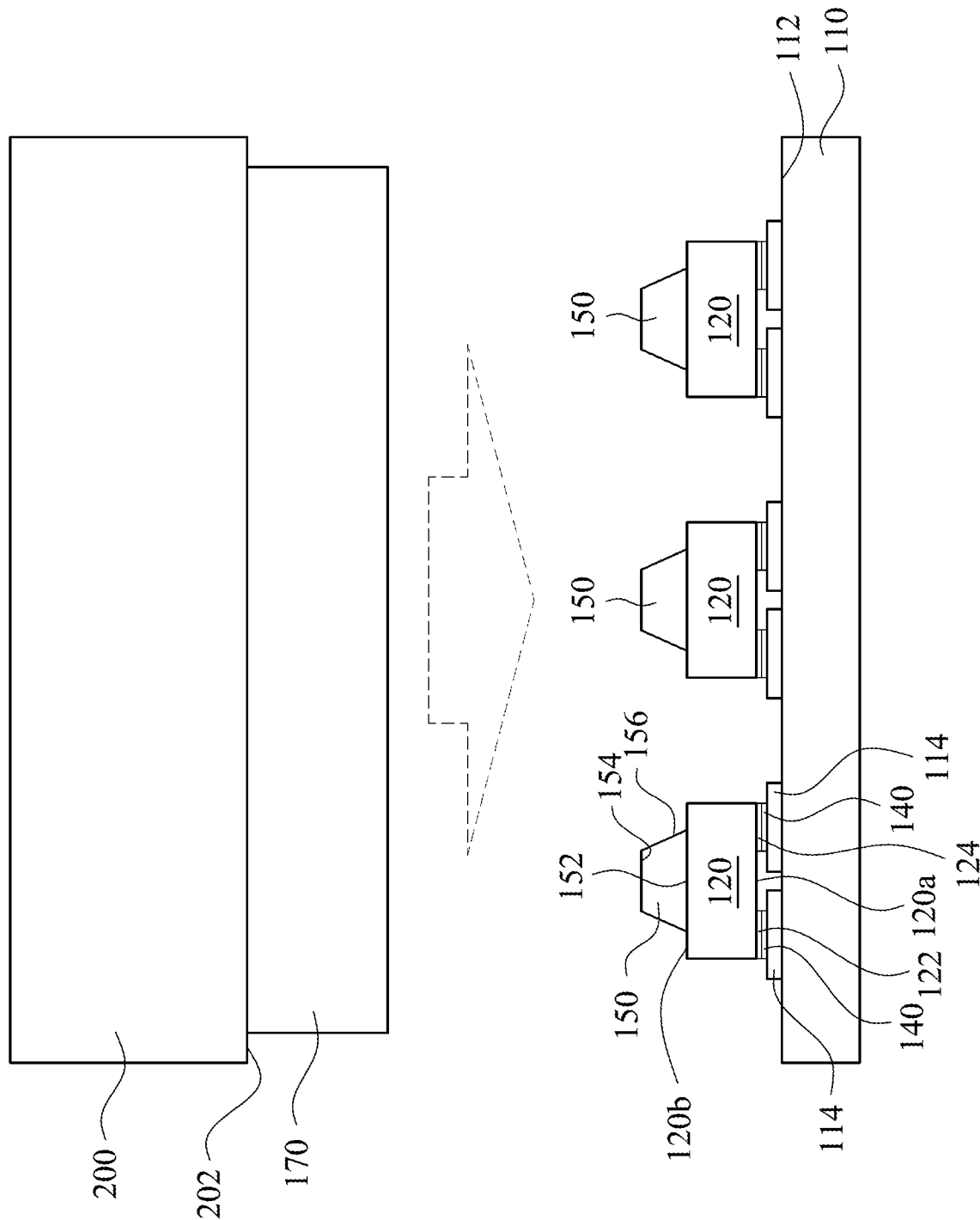
Figure 6C:
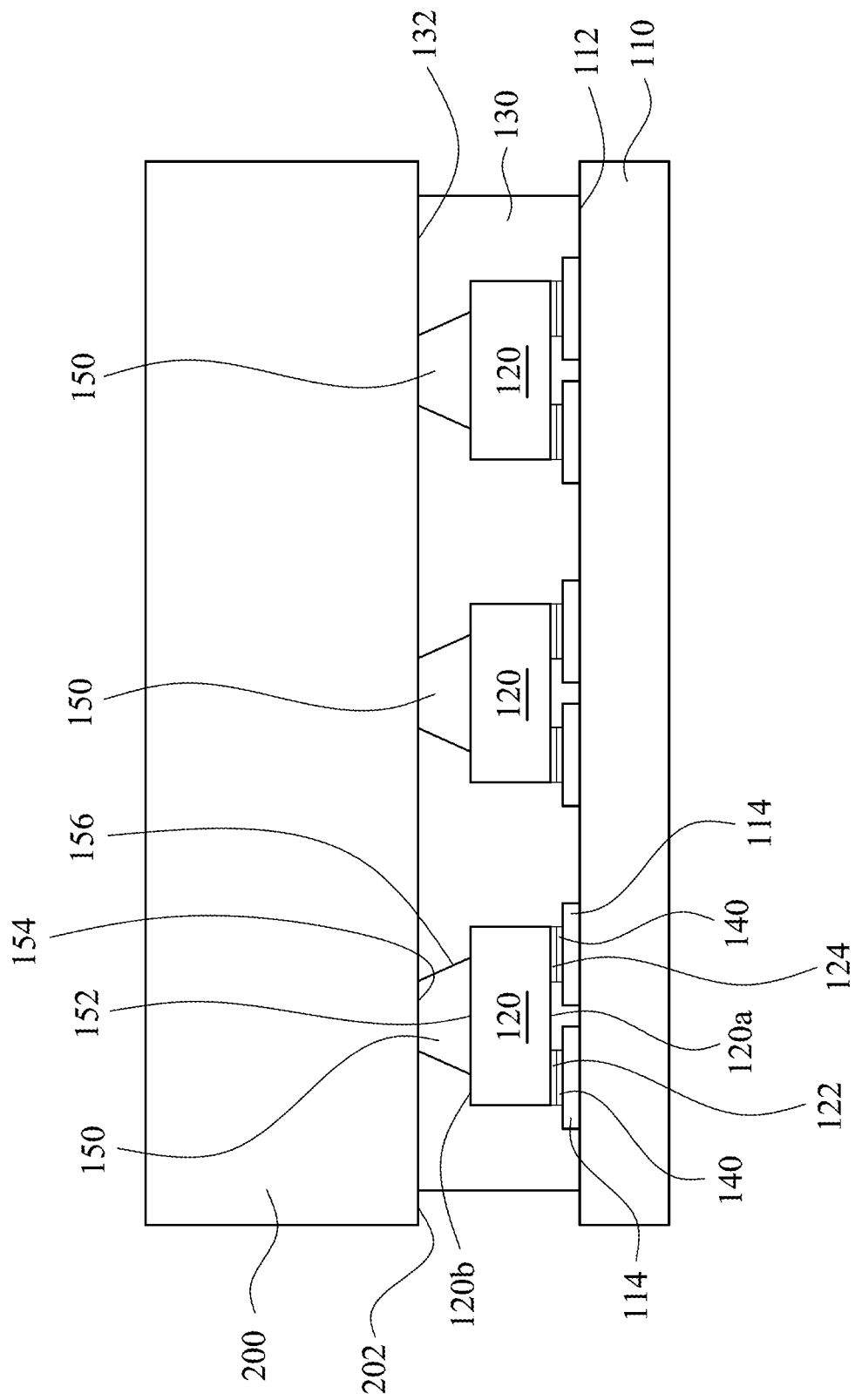
Figure 6D:
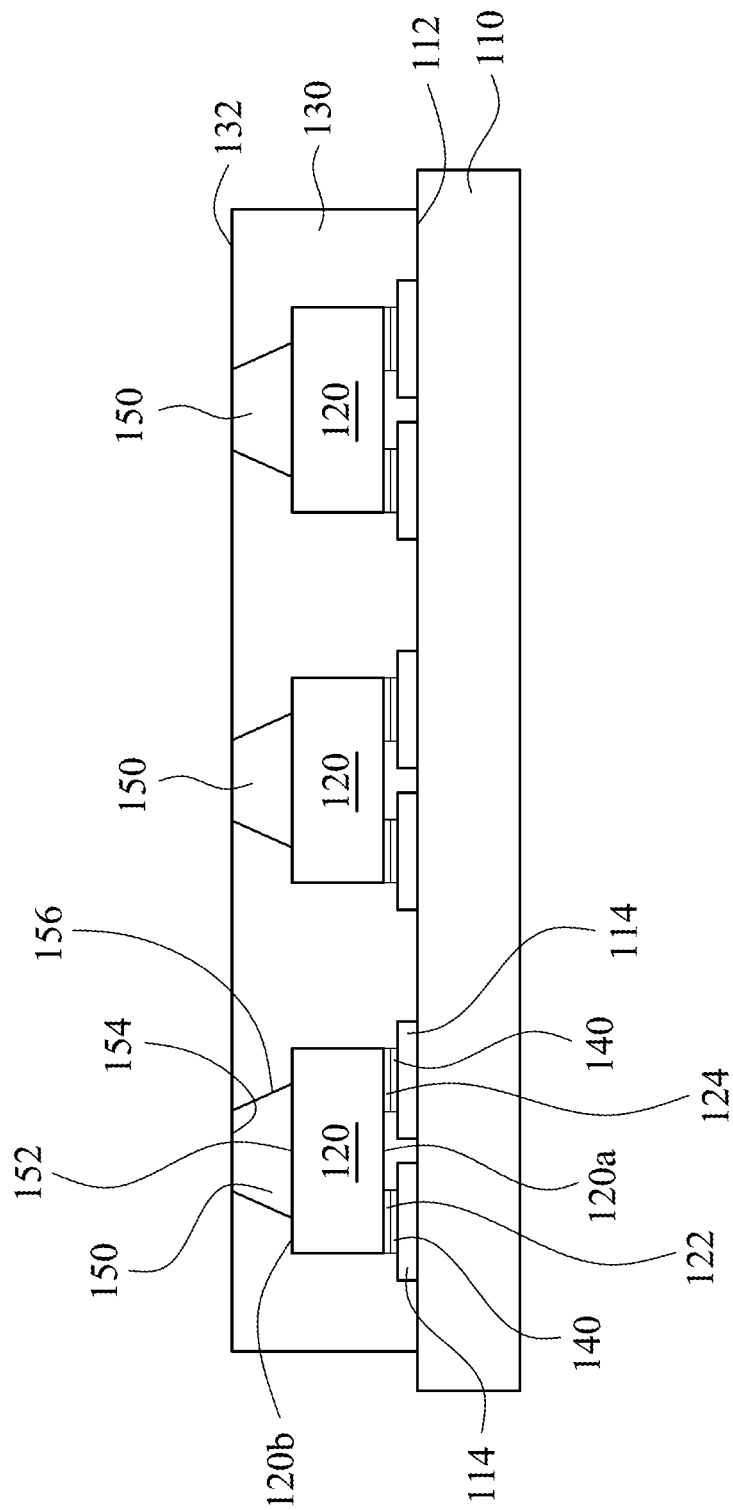

FIG. 6A to FIG. 6D are schematic partial cross-sectional views of various stages showing a package method of a micro LED display in accordance with one embodiment of the present disclosure. When a package process is performed to form a micro LED display 100a as shown in FIG. 6D, various micro LED chips 120 and a substrate 110 may be provided firstly. The examples of the types, the structures, and the materials of the micro LED chips 120 and the substrate 110 have been described in the above embodiments, and are not repeated herein.

In providing of the micro LED chips 120, one or more micro structures 150 may be firstly disposed on the light-emitting surface 120b of each of the micro LED chips 120. The examples of the shape, the material, the arrangement, and the size of the micro structures 150 have been described in the above embodiments, and are not repeated herein. In addition, the micro structures 150 of the present embodiment may be replaced with the micro structures 160 shown in FIG. 4.

Then, the micro LED chips 120 are disposed on a surface 112 of the substrate 110. For example, as shown in FIG. 6A, a first electrode 122 and a second electrode 124 of each of the micro LED chip 120 may be respectively connected to a wire 114 on the surface 112 of the substrate 110 by using conductive bonding layers 140, to electrically connect the micro LED chip 120 and the wire 114.

After the micro LED chips 120 are adhered to the wire 114 on the surface 112 of the substrate 110, an encapsulation film 130 may be provided, and a softening treatment may be performed on the encapsulation film 130. In some examples, the encapsulation film 130 may be softened by heating the encapsulation film 130. In such examples, the encapsulation film 130 may include a thermoplastic material, such as ethylene vinyl acetate (EVA), polymethyl methacrylate (PMMA), acrylic acid, resin, rubber, polyurethane, or any combination thereof. When the encapsulation film 130 is softened by using a heating method, a temperature of the encapsulation film 130 may be risen to a range, which is from about 80 degrees centigrade to about 150 degrees centigrade.

In softening of the encapsulation film 130, a heating plate or an infrared heater may be used to heat the encapsulation film 130, for example. In some exemplary examples, the encapsulation film 130 may be heated by a pressure plate 200, which is subsequently used to press the encapsulation film 130. In such examples, the pressure plate 200 itself may have a heating function; or the pressure plate 200 may not have a heating function, and an additional heating device may be used to indirectly heat the encapsulation film 130 through the pressure plate 200. Referring to FIG. 6B, the encapsulation film 130 may be firstly disposed on a surface 202 of the pressure plate 200. For example, the surface 202 of the pressure plate 200 may be a flat surface for benefitting a step of pressing the encapsulation film 130. Then, the encapsulation film 130 may be directly heated by the pressure plate 200, or may be indirectly heated by the pressure plate 200 via the additional heating device, so as to soften the encapsulation film 130.

In the present disclosure, it is not limited to using the heating method to soften the encapsulation film 130, and it can select any suitable method to soften the encapsulation film 130 according to a material property of the encapsulation film 130.

Referring to FIG. 6B continuously, after the encapsulation film 130 is softened, the pressure plate 200 may be used to carry the encapsulation film 130 and to apply pressure to the softened encapsulation film 130, so as to adhere the encapsulation film 130 to the surface 112 of the substrate 110. When the encapsulation film 130 is pressed onto the surface 112 of the substrate 110, the micro structures 150 may penetrate the softened encapsulation film 130 until the top ends 154 contact and are against the surface 202 of the pressure plate 200, as shown in FIG. 6C. At this time, the encapsulation film 130 can completely cover the micro LED chips 120 and the surface 112 of the substrate 110, and the light-emitting surface 132 of the encapsulation film 130 is flat. Thus, the light-emitting surface 132 of the encapsulation film 130 are flush with the top ends 154 of the micro structures 150, i.e. the top ends 154 of the micro structures 150 are located in the light-emitting surface 132 of the encapsulation film 130. In addition, the encapsulation film 130 may fill up the space between the micro LED chips 120. In some examples, the micro structures 150 may not penetrate the encapsulation film 130 completely, such that the encapsulation film 130 may encapsulate the micro structures 150 completely, and the top ends 154 of the micro structures 150 are not exposed.

Then, the pressure plate 200 is removed to substantially complete the package of the micro LED display 100a. As shown in FIG. 6D, the light-emitting surface 132 of the encapsulation film 130 is evened and is flush with the top ends 154 of the micro structures 150 on the micro LED chips 120 under the pressing of the pressure plate 200, such that the surface of the micro LED display 100a is even without any gap.

The package method of the present embodiment can fill the space between the micro LED chips 120 with the encapsulation film 130, such that the encapsulation film 130 and the micro LED chips 120 are combined tightly, and an area of the encapsulation film 130 connected to the surface 112 of the substrate 110 is increased. Thus, stability of the micro LED chips 120 on the substrate 110 is strengthened, and yield of the micro LED display 100a is effectively enhanced. In addition, the package method can form the micro LED display 100a having an even surface without any gap, such that display quality is significantly enhanced. Moreover, the package method can omit an additional coating process for encapsulation glue, such that cost of a coating apparatus is saved, thereby effectively reducing process cost.

Figure 7A:
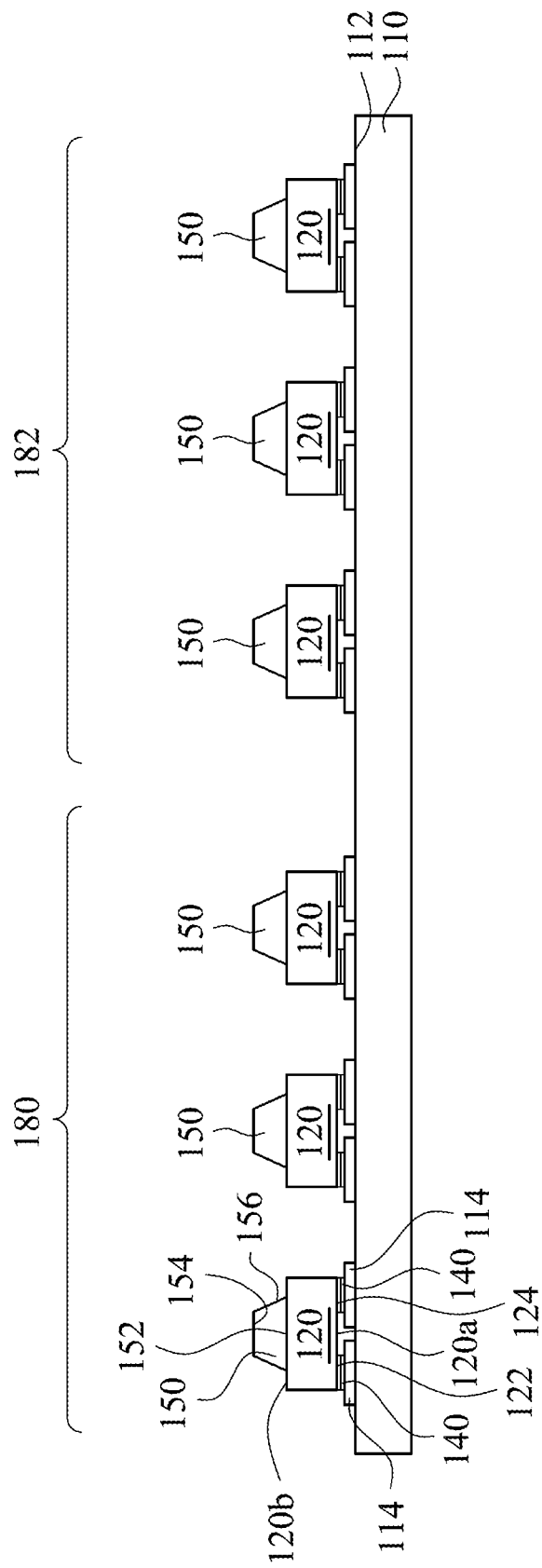
FIG. 7A to FIG. 7D are schematic partial cross-sectional views of various stages showing a package method of a micro LED display in accordance with one embodiment of the present disclosure.
Figure 7B:
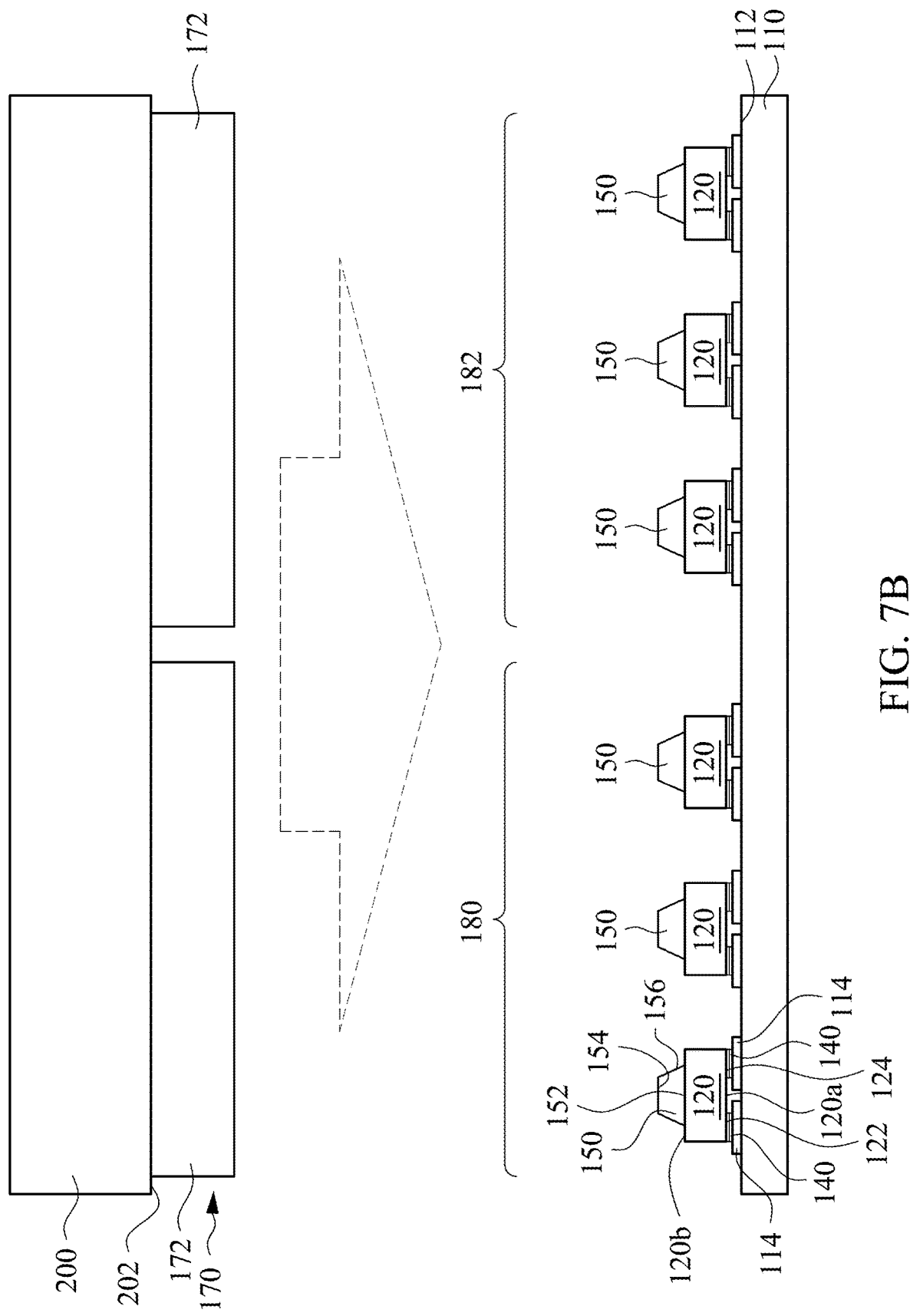
Figure 7C:
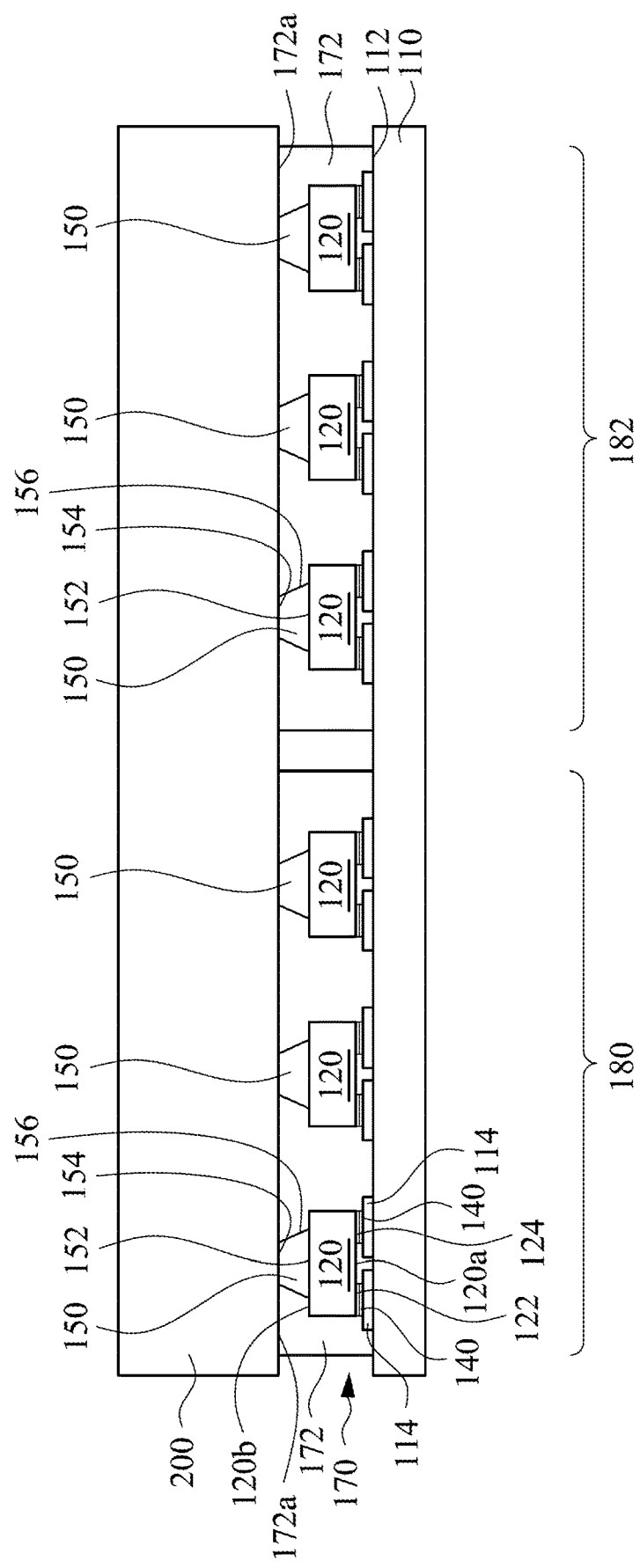
Figure 7D:
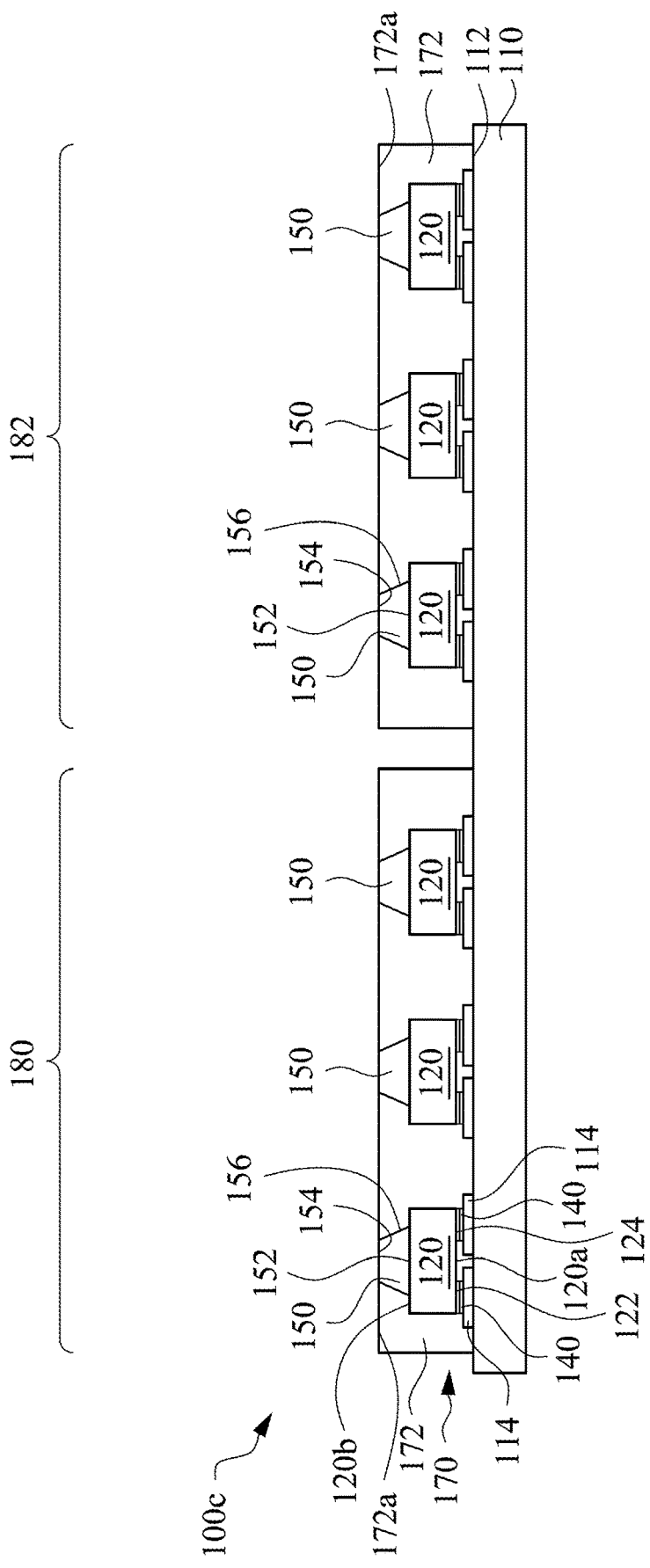

FIG. 7A to FIG. 7D are schematic partial cross-sectional views of various stages showing a package method of a micro LED display in accordance with one embodiment of the present disclosure. When a package process is performed to form the micro LED display 100c as shown in FIG. 7D, various micro LED chips 120 and a substrate 110 may be provided firstly. The examples of the types, the structures, and the materials of the micro LED chips 120 and the substrate 110 have been described in the above embodiments, and are not repeated herein.

In providing of the micro LED chips 120, one or more micro structures 150 may be firstly disposed on a light-emitting surface 120b of each of the micro LED chips 120. The examples of the shape, the material, the arrangement, and the size of the micro structures 150 have been described in the above embodiments, and are not repeated herein. Similarly, the micro structures 150 of the present embodiment may be replaced with the micro structures 160 shown in FIG. 4.

Next, as shown in FIG. 7A, the micro LED chips 120 may be connected to the surface 112 of the substrate 110 by using conductive bonding layers 140. The first electrode 122 and the second electrode 124 of each of the micro LED chip 120 may be fixed to the wire 114 on the surface 112 of the substrate 110 by respectively using conductive bonding layers 140, so as to electrically connect the micro LED chip 120 and the wire 114.

In the present disclosure, the micro LED chips 120 on the surface 112 of the substrate 110 are divided into various groups, such as the groups 180, 182, 184, and 186 shown in FIG. 5. FIG. 7A only illustrates two of the groups 180 and 182 in FIG. 5. Quantity of the micro LED chips 120 of each of the groups 180, 182, 184, and 186 has to be greater than one. For example, as shown in FIG. 5, each of the groups 180, 182, 184, and 186 includes nine micro LED chips 120. The quantity of the micro LED chips 120 of each group may be adjusted according to the product and process requirements, and the present disclosure is not limited thereto. The micro LED chips 120 of each of the groups 180, 182, 184, and 186 are located on the same area for a package benefit.

Then, the encapsulation film 170 may be provided and placed on a surface 202 of a pressure plate 200. The encapsulation film 170 includes various encapsulation film blocks 172. Quality of the encapsulation film blocks 172 is the same as that of the groups of the micro LED chips 120. In addition, as shown in FIG. 7B, the encapsulation film blocks 172 are arranged on the surface 202 of the pressure plate 200 to respectively correspond locations of the encapsulation film blocks 172 to those of the groups 180 and 182 of the micro LED chips 120 on the surface 112 of the substrate 110.

The encapsulation film blocks 172 on the pressure plate 200 are separated from each other physically. As shown in FIG. 7B, the surface 202 of the pressure plate 300 is a flat surface, for example. In some examples, a carrying surface of a pressure plate may not be a flat surface, and may include various planar portions separated from each other to respectively carry the encapsulation film blocks 172. An area of each planar portion is greater than that of the corresponding encapsulation film block 172, such that a surface 172a (referring to FIG. 7C firstly) of the encapsulation film block 172 is a flat surface after pressing.

Subsequently, a softening treatment is performed on the encapsulation film blocks 172 on the pressure plate 200. In some examples, the encapsulation film blocks 172 may be softened by using a heating method. Similarly, the encapsulation film blocks 172 may include a thermoplastic material, such as ethylene vinyl acetate (EVA), polymethyl methacrylate (PMMA), acrylic acid, resin, rubber, polyurethane, or any combination thereof. When the encapsulation film blocks 172 are softened, a temperature of the encapsulation film blocks 172 may be risen to a range, which is from about 80 degrees centigrade to about 150 degrees centigrade.

In some examples, a heating plate or an infrared heater may be used to heat the encapsulation film blocks 172. When the encapsulation film blocks 172 are heated, a heating device, such as a heating plate or an infrared heater, may be used to indirectly heat the encapsulation film blocks 172 through the pressure plate 200. When the pressure plate 200 itself has a heating function, the pressure plate 200 may be used to directly heat the encapsulation film blocks 172 disposed thereon. Similarly, in the present disclosure, it is not limited to using the heating method to soften the encapsulation film blocks 172, and it can select any suitable softening method according to a material property of the encapsulation film blocks 172.

As shown in FIG. 7B, the encapsulation film blocks 172 are moved toward the surface 112 of the substrate 110, and pressure is applied to the softened encapsulation film blocks 172 by using the pressure plate 200, such that the encapsulation film blocks 172 respectively encapsulate the micro LED chips 120 in the corresponding groups 180 and 182 and are adhered to the surface 112 of the substrate 110. As shown in FIG. 7C, when the encapsulation film blocks 172 are pressed onto the surface 112 of the substrate 110, the micro structures 150 may correspondingly penetrate the softened encapsulation film blocks 172 until the top ends 154 contact and are against the surface 202 of the pressure plate 200. In the present embodiment, the surfaces 172a of all of the encapsulation film blocks 172 are even and flush with each other. In addition, the surface 172a of the encapsulation film blocks 172 are also flush with the top ends 154 of the micro structures 150, such that the top ends 154 of the micro structures 260 are located in the surfaces 172a of the corresponding encapsulation film blocks 172.

After pressing, each of the encapsulation film blocks 172 can completely encapsulate all of the micro LED chips 120 in the corresponding group 180 or 182, and cover the area of the surface 112 of the substrate 110 where the group 180 or 182 is located. In addition, the encapsulation film block 172 may fill up the space between the micro LED chips 120 in the corresponding group 180 or 182. In some examples, the encapsulation film blocks 172 pressed on the surface 112 of the substrate 110 may be separated from each other to form an island package structure, as shown in FIG. 7C. However, all or portions of the encapsulation film blocks 172 on the surface 112 of the substrate 110 may be connected to each other.

Subsequently, the pressure plate 200 may be removed to substantially complete the package of the micro LED display 100c. As shown in FIG. 7D, the surfaces 172a of the encapsulation film blocks 172 are even and flush with each other, and are also flush with the top ends 154 of the micro structures 150 on the micro LED chips 120 under the pressing of the pressure plate 200, such that a surface of the micro LED display 100c is evened.

According to the aforementioned embodiments, one advantage of the present disclosure is that the present disclosure encapsulates the micro LED chips by mounting the micro structures on the substrate, softening the encapsulation film, and pressing the softened encapsulation film on the substrate and the micro LED chips by using the pressure plate. When the encapsulation film is pressed, the micro structures penetrate the encapsulation film to be against the pressure plate, such that all of the micro LED chips are completely encapsulated in the encapsulation film, and thus the encapsulation film and the micro LED chips are tightly combined, thereby increasing stability of the micro LED chips on the substrate. In addition, the process of the package method, which is performed by pressing the softened encapsulation film, is easily controlled, and an additional coating process of the encapsulation glue is omitted, such that cost of a coating apparatus is eliminated, thereby decreasing process cost.

According to the aforementioned embodiments, another advantage of the present disclosure is that the micro structures on the micro LED chips of the present disclosure are flush with the light-emitting surface of the encapsulation film, such that the surface of the micro LED display is even, thereby enhancing display quality of the micro LED display. Moreover, the micro structures on the light-emitting surfaces of the micro LED chips prevent light emitted by the micro LED chips from being limited by the inner structures, such that light extraction of the micro LED chips is increased.

The features of several embodiments are outlined above, so those skilled in the art can understand the aspects of the present disclosure. Those skilled in the art will appreciate that the present disclosure can be readily utilized as a basis for designing or modifying other processes and structures, thereby achieving the same objectives and/or achieving the same advantages as the embodiments described herein. Those skilled in the art should also understand that these equivalent constructions do not depart from the spirit and scope of the present disclosure, and they can make various changes, substitutions, and alteration without departing from the spirit and scope of the present disclosure.

What is claimed is:

1. A micro light-emitting diode display, comprising:
a substrate comprising a wire;
a plurality of micro light-emitting diode chips disposed on a surface of the substrate and electrically connected to the wire, wherein a light-emitting surface of each of the micro light-emitting diode chips is set with at least one micro structure, each of the micro structure has a top end, and a bottom surface of the at least one micro structure on each of the micro light-emitting diode chips is smaller than or equal to the light-emitting surface of the micro light-emitting diode chip; and
an encapsulation film encapsulating the micro light-emitting diode chips, and covering the surface of the substrate, wherein the top ends of the micro structures are located in a light-emitting surface of the encapsulation film.

2. The micro light-emitting diode display of claim 1, wherein each of the micro structures comprises a cone, a polygon pyramid, an arc lens, a micro lens, a cone frustum, or a polygon frustum.

3. The micro light-emitting diode display of claim 1, wherein the micro structures have a same shape and a same size.

4. The micro light-emitting diode display of claim 1, wherein a refractive index of each of the micro structures is greater than a refractive index of the encapsulation film, and is smaller than a refractive index of a semiconductor layer of each of the micro light-emitting diode chips.

5. The micro light-emitting diode display of claim 1, wherein a height of each of the micro structures ranges from 3 μm to 10 μm.

6. The micro light-emitting diode display of claim 1, wherein each of the micro structures is a light-guiding structure, and the light-guiding structure comprises a main body and a reflective layer covering a side surface of the main body.

7. The micro light-emitting diode display of claim 1, wherein each of the micro structures comprises an inverted frustum structure, and the inverted frustum structure comprises a reflective side surface.

8. The micro light-emitting diode display of claim 1, wherein materials of the micro structures comprise silicon dioxide, titanium dioxide, aluminum oxide, or any combination thereof.

9. The micro light-emitting diode display of claim 1, wherein the encapsulation film completely covers the surface of the substrate.

10. The micro light-emitting diode display of claim 1, wherein the encapsulation film comprises a plurality of encapsulation film blocks, and the encapsulation film blocks are separated from each other.

11. The micro light-emitting diode display of claim 10, wherein the micro light-emitting diode chips are divided into a plurality of groups, and the encapsulation film blocks respectively encapsulate the groups.

12. The micro light-emitting diode display of claim 1, wherein a material of the encapsulation film comprises ethylene vinyl acetate (EVA), polymethyl methacrylate (PMMA), acrylic acid, resin, rubber, polyurethane, or any combination thereof.

* * * * *